(12) United States Patent
Dütting et al.

(10) Patent No.: US 6,181,722 B1
(45) Date of Patent: Jan. 30, 2001

(54) OPTICAL SEMICONDUCTOR COMPONENT WITH A DEEP RIDGED WAVEGUIDE

(75) Inventors: Kaspar Dütting; Edgar Kühn, both of Stuttgart (DE)

(73) Assignee: Alcatel, Paris (FR)

( * ) Notice: Under 35 U.S.C. 154(b), the term of this patent shall be extended for 0 days.

(21) Appl. No.: 09/029,722

(22) PCT Filed: Jun. 26, 1997

(86) PCT No.: PCT/EP97/03585

§ 371 Date: Sep. 1, 1998

§ 102(e) Date: Sep. 1, 1998

(87) PCT Pub. No.: WO98/00894

PCT Pub. Date: Jan. 8, 1998

(30) Foreign Application Priority Data

Jun. 28, 1996 (DE) .............................................. 196 26 113

(51) Int. Cl.⁷ ........................................................ H01J 3/19
(52) U.S. Cl. ................................ 372/45; 372/46; 372/50; 385/131
(58) Field of Search ................... 385/49, 14, 43, 385/131; 372/45, 46, 50

(56) References Cited

U.S. PATENT DOCUMENTS

| | | | | |
|---|---|---|---|---|
| 5,933,562 | * | 8/1999 | Dutting et al. | 385/131 |
| 5,937,120 | * | 8/1999 | Higashi | 385/49 |
| 5,987,046 | * | 11/1999 | Kobayashi et al. | 372/45 |
| 6,037,189 | * | 3/2000 | Goto | 372/45 |
| 6,052,397 | * | 4/2000 | Jeon et al. | 372/46 |

FOREIGN PATENT DOCUMENTS

| | | |
|---|---|---|
| 0641049 | 3/1995 | (EP) . |
| 9800894 | 1/1998 | (WO) . |

OTHER PUBLICATIONS

"Ultrahigh–bandwidth (42GHz) polarisation–independent ridge wageguide electroabsorption modulator based on tensile strained InGaAsP MQW", K. Satzke et al, *Electronics Letters*, Nov. 9, 1995, vol. 31, No. 23, pp. 2030–2032.

"Compact InGaAsP/InP laser diodes with integrated mode expander for efficient coupling to flat–ended singlemode fibres", T. Brenner et al, *Electronics Letters*, Aug. 17, 1995, vol. 31, No. 17, pp. 1443–1445.

"Monolithic Integration of AgInAsP/InP Collimating GRIN Lens with Tapered Waveguide Active Region", S. El Yumin et al, Proc. International Conf. on Indium Phosphide and Related Materials, Hokkido, May 9–13, 1997, pp. 721–724.

"Theoretische Untersuchung optischer Wellenleitertaper auf InGaAsP/InP", H–P. Nolting et al, *Frequenz*, vol. 45, No. 5/06, May 1, 1991, pp. 130–140.

* cited by examiner

*Primary Examiner*—Hemang Sanghavi

(57) ABSTRACT

Digital optical telecommunications use optical semiconductor components which contain a transition area for the expansion of the mode field of a light wave, in order to reduce coupling losses when coupling an optical fiber or an optical waveguide of a supporting plate. An optical semiconductor component (BE1; BE2) contains a deep ridged waveguide (RIDGE) with a cover layer (DS), which are arranged on a substrate (SUB). The ridged waveguide (RIDGE) has a first (MQW) and a second (BULK) waveguide core. The first waveguide core (MQW) contains one or several optically active semiconductor layers. In a first transition area (UB1), the layer thickness of the second waveguide core (BULK) decreases along a longitudinal direction (L) of the ridged waveguide (RIDGE). This causes a light wave being conducted in the optical semiconductor component (BE1; BE2) to divert into the semiconductor material of the cover layer (DS) and the substrate (SUB) surrounding the waveguide core, thereby expanding its mode field.

6 Claims, 2 Drawing Sheets

OPTICAL SEMICONDUCTOR COMPONENT WITH A DEEP RIDGED WAVEGUIDE

BACKGROUND OF THE INVENTION

1. Technical Field

The invention concerns an optical semiconductor component as claimed in patent claim 1.

2. Discussion of Related Art

Optical semiconductor components are used in digital optical telecommunications e.g. as transmitting or receiving components, and are coupled to optical waveguides on a supporting plate, or to optical fibers. Optical semiconductor components with a deep ridged waveguide are especially used for the highest bit frequencies in telecommunications, since they have the highest frequency bandwidth due to their low electrical capacity, as is compared to optical semiconductor components with other types of waveguides.

A deep ridged waveguide is an optical waveguide formed of a mesa-shaped ridge on a substrate, and the ridge contains waveguide layers having a higher refraction index than the substrate. Especially in actively operated, i.e. controlled light absorbing or amplifying deep ridged waveguides, the ridge contains optically active semiconductor layers, and thereby a zone containing the transition from p-doped to n-doped semiconductor material. The ridge which is several Am wide is laterally surrounded by material that is electrically nonconducting and has a clearly smaller refraction index, such as e.g. air or polyimide.

In contrast thereto, a flat ridged waveguide represents an optical waveguide in which at least a part of the existing waveguide layers are arranged under a mesa-shaped ridge which is several $\mu$m wide. Particularly in actively operated flat ridged waveguides, the optically active semiconductor layers are not part of the ridge, thus the zone containing the transition from p-doped to n-doped semiconductor material is not laterally limited to the several Am wide ridge.

In order to couple a light wave being conducted in an optical semiconductor component as much as possible without loss into an optical waveguide or an optical fiber, it is necessary to adapt the mode field of the light wave in the semiconductor component to the mode field of a light wave in the optical waveguide or in the optical fiber. To that end the mode field of the light wave being conducted in the semiconductor component is adiabatically amplified along the light propagation direction.

To adapt the mode field, the optical semiconductor components use waveguides containing a transition area in which the waveguide, or individual layers of the waveguide, taper or widen laterally along a longitudinal direction of the waveguide, meaning the direction in the substrate plane that is vertical to the light propagation direction, or vertically, meaning the direction that is vertical to the substrate plane. Such a transition area is also called a taper. A vertical taper particularly defines a transition area in which the thickness of a semiconductor layer increases or decreases, and a lateral taper defines a transition area in which the width of a waveguide increases or decreases along a longitudinal direction.

The article "Compact InGaAsP/InP laser diodes with integrated mode expander for efficient coupling to flat-ended single-mode fibre" (T. Brenner et al, Electronic Letters, Volume 31, No. 7 1995, pages 1443–1445) describes an optical semiconductor component with a flat ridged waveguide. It contains an optically active waveguide layer and a ridge arranged on this waveguide layer. The thickness of the optically active waveguide layer decreases in a transition area along a longitudinal direction of the ridged waveguide in the direction of an outlet facet of the component, and the ridged waveguide widens laterally in the direction of the outlet facet. The ridged waveguide and the transition area are equipped with electrodes, and are actively operated by applying a voltage.

The described semiconductor component has a higher capacity than semiconductor components with deeply etched ridged waveguides, particularly in the actively operated transition area. In addition, in a ridged waveguide in which the mode field adaptation takes place mainly through an actively operated lateral taper, higher modes than the basic mode are excited, so that such a waveguide loses its single modality.

SUMMARY OF THE INVENTION

The object of the invention is to present an optical semiconductor component that is suitable for the highest transmission rates, and can be coupled in a mostly loss-free manner to an optical fiber or to an optical waveguide.

According to the present invention, an optical semiconductor component which has a substrate and a deep ridged waveguide with a cover layer arranged on the substrate is characterized in that the ridged waveguide contains a first waveguide core and a second waveguide core, whose respective refractive indexes are greater than refractive indexes of the cover layer and the substrate, the first waveguide core contains one or several optically active semiconductor layers, and in a first transition area, a thickness of the second waveguide core decreases along a longitudinal direction of the deep ridged waveguide.

In further accord with the present invention, the optical semiconductor component is characterized further in that it has a front face for incoming or outgoing light signals, and the thickness of the second waveguide core decreases along the longitudinal direction of the ridged waveguide toward the front facet.

In still further accord with the present invention, the optical semiconductor component is further characterized in that the decrease in a layer thickness of the second waveguide core is continuous.

Further in accordance with the present invention, the optical semiconductor component is further characterized in that the one or several optically active semiconductor layers of the first waveguide core are a semiconductor packet with a multi-quantum well structure.

Still further in accord with the present invention, the optical semiconductor component is further characterized in that in a second transition area, thickness of individual layers of the semiconductor packet of the first waveguide core decreases in a same direction along which the thickness of the second waveguide core decreases in said longitudinal direction.

In further accord with the present invention, the optical semiconductor component is further characterized in that in a third transition area, a width of the ridged waveguide increases in a same direction along which the thickness of the second waveguide core decreases in said longitudinal direction.

According still further to the present invention, the optical semiconductor component is further characterized in that on the front face, the ridged waveguide has a termination in the form of an integrated cylindrical lens with a hyperbolic, parabolic or circle segment shaped base.

BRIEF DESCRIPTION OF THE DRAWING

Two embodiments of the optical semiconductor components of the invention are described in the following by means of FIGS. 1 to to 4, where.

DETAILED DESCRIPTION OF PREFERRED EMBODIMENTS

An optical semiconductor component of the invention has a deep ridged waveguide with a first waveguide core arranged on a substrate. The first waveguide core has one or several optically active semiconductor layers. A first transition area is used to adapt the mode field of a light wave being conducted in the ridged waveguide to the mode field of a light wave in an optical fiber, or in an optical waveguide located on a supporting plate. A basic idea of the invention is to use a lateral taper to adapt the mode field of a light wave being conducted in the ridged waveguide, namely a layer whose thickness decreases in the first transition area along a longitudinal direction of the ridged waveguide, but to carry out this lateral taper independently of the structure of the layer thickness of the one or several optically active semiconductor layers. To that end the ridged waveguide contains a second waveguide core whose layer thickness decreases in the first transition area for the adaptation of the mode field along the longitudinal direction.

One advantage of the invention is that the adaptation of the mode field in the first transition area is independent of a variation of the layer thickness of the first waveguide core along the longitudinal direction of the ridged waveguide. Since the energy band gap of the optically active semiconductor layers is determined by their layer thickness and material composition, the adaptation of the mode field is independent of the energy band gap of the optically active semiconductor layers. In that way the optical semiconductor component can therefore have active, i.e. controlled light amplifying or light absorbing waveguide areas, and passive, i.e. unamplified light conducting waveguide areas.

Figure 1:
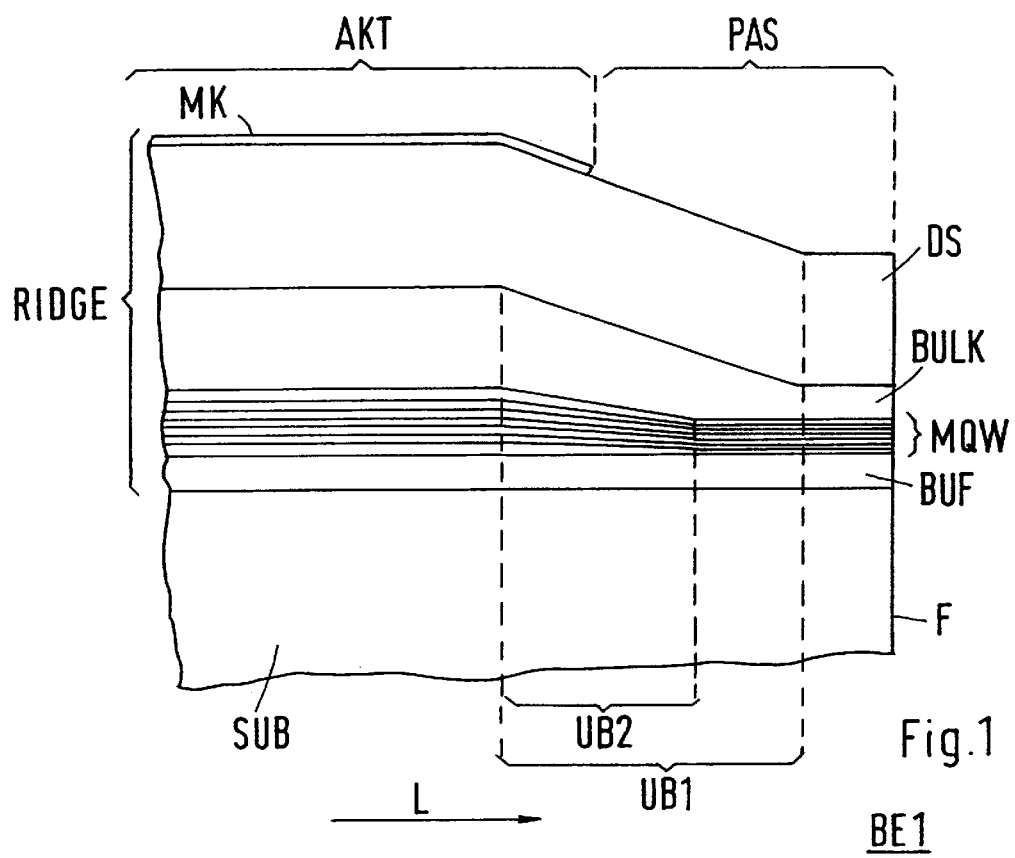
FIG. 1 is a sectional view, i.e., a cut through an optical semiconductor component of the invention in a first embodiment along a longitudinal direction of a waveguide, vertical to the substrate plane.

FIG. 1 illustrates a sectional view, i.e., a cut through an optical semiconductor component BE1 of the invention in a first embodiment. The cut extends vertically to the plane of a substrate SUB along a longitudinal direction L of a deep ridged waveguide RIDGE.

The deep ridged waveguide RIDGE is arranged on the substrate SUB and contains superimposed a buffer layer BUF, a first waveguide core MQW, a second waveguide core BULK, a cover layer DS and a metal contact layer MK.

The first and the second waveguide cores MQW, BULK have respective refractive indexes which are greater than the refractive indexes of the cover layer DS, the buffer layer BUF and the substrate SUB. This causes a light wave to be conducted mainly in the two waveguide cores MQW, BULK.

The first waveguide core MQW contains one or several optically active semiconductor layers. Optically active semiconductor layers represent the transition from p-doped to n-doped semiconductor material and are characterized in that they interact with a light wave being conducted in the ridged waveguide RIDGE. Electronic transitions are induced in that case between the valence and the conduction band of the one or several optically active semiconductor layers, either in the form of absorption or the induced emission of light. This amplifies or absorbs a light wave, and the amplification or attenuation factor can be adjusted with the selection of an injection current or an applied voltage.

The one or several optically active semiconductor layers are preferably a semiconductor packet with a multi-quantum well structure, meaning a packet of semiconductor layers with an alternating large and small energy band gap. Energy band gap in that case means the energy difference between the valence and the conduction band of the material forming the layer.

In a first transition area UB1, the thickness of the second waveguide core BULK decreases along the longitudinal direction L of the ridged waveguide RIDGE. This causes the mode field of a light wave being conducted in the ridged waveguide to be expanded.

It is especially advantageous if the increase of the second waveguide core BULK is continuous along the longitudinal direction L of the ridged waveguide RIDGE. The light wave being conducted in the ridged waveguide RIDGE then undergoes especially little scatter and absorption in the first transition area UB1. The increase in the second waveguide core BULK along the longitudinal direction L of the ridged waveguide RIDGE can take place linearly as in the first embodiment, or also exponentially for example.

Figure 2:
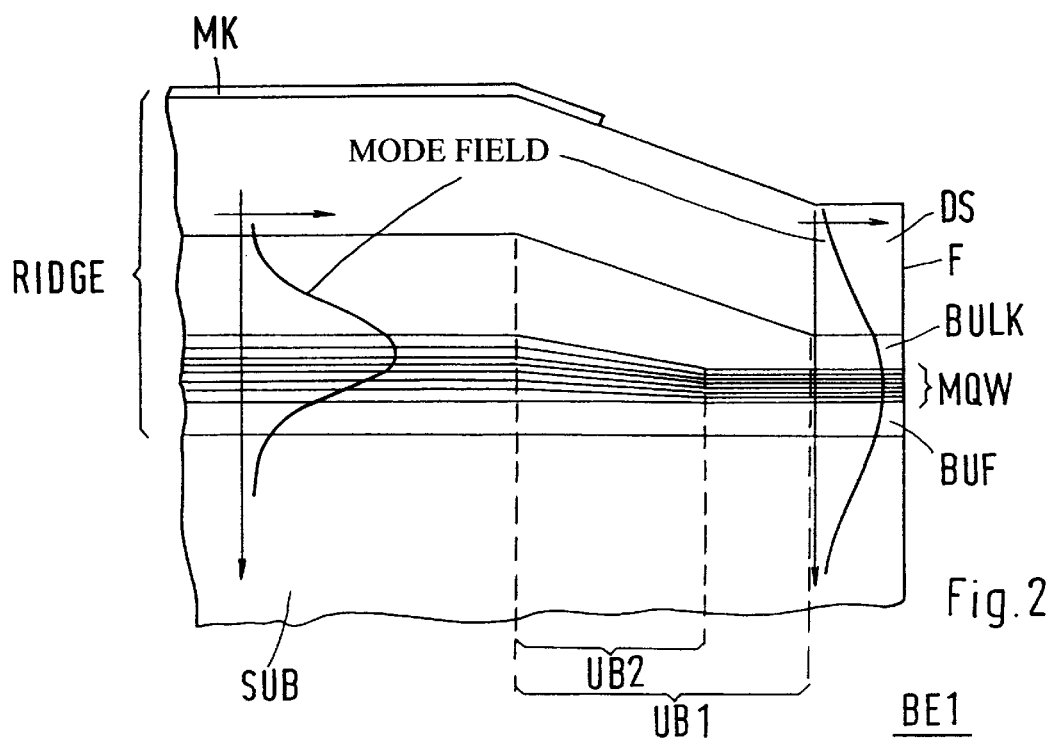
FIG. 2 is the same cut as in FIG. 1, and in addition shows in a qualitative way the course of the mode field of a light wave that is conducted in the waveguide, on both sides of a transition area.

In addition to the section of FIG. 1, FIG. 2 also illustrates qualitatively the course of the mode field of a light wave being conducted in the ridged waveguide RIDGE on both sides of the first transition area UB1. In that case the magnitude of the electrical field vector of the light wave is indicated for example in the longitudinal direction L of the ridged waveguide RIDGE, and a local coordinate is vertical to the substrate plane. The diagrams make it clear that the mode field of the light wave is expanded by the decrease in the second waveguide core BULK. The reason is that the light wave is no longer conducted in the waveguide core BULK which tapers along the first transition area UB1, and is more and more diverted into the surrounding semiconductor material of cover layer DS, substrate SUB and buffer layer BUF.

The optical semiconductor component BE1 in the first embodiment has a front face F from which light signals can emerge, or through which light signals can enter into the optical semiconductor component BE1. An optical fiber or an optical waveguide located on a supporting plate can be coupled to this front face F. To that end the second waveguide core BULK is designed so that its thickness decreases toward the front face F along the longitudinal direction L of the ridged waveguide RIDGE.

In a particularly advantageous configuration of the invention, the thickness of the individual semiconductor layers of the multi-quantum well structure decreases in a second transition area UB2 along the longitudinal direction L of the ridged waveguide RIDGE. The reduction in the thickness of the individual semiconductor layers takes place in the same direction in which the thickness of the second waveguide core BULK decreases as well.

The energy band gap of the multi-quantum well structure, and thereby the wavelength at which a multi-quantum well structure is optically active, depends essentially on the thickness of its individual semiconductor layers. The reduction in the thickness of its individual semiconductor layers in the second transition area UB2 shifts the wavelength, at which the multi-quantum well structure is optically active, to shorter wavelengths. This makes it possible to operate a part of the ridged waveguide RIDGE passively, i.e., by conducting unamplified light. The optical semiconductor component BE2 has an active waveguide area AKT in which the semiconductor layers are thicker, and a passive waveguide area PAS in which the semiconductor layers have less thickness. A metal contact layer MK is only applied to the active waveguide area AKT of the ridged waveguide RIDGE.

It is an advantage if the second transition area UB2 is arranged so that it overlaps at least partly the first transition area UB1. This achieves an altogether shorter length of the semiconductor component BE2. However, it is advantageous if the second transition area UB2 is arranged in the longitudinal direction L partially before or in the front part of the first transition area UB1, because in that case the active waveguide area AKT, which must be operated by injecting a current, does not extend over the entire first transition area UB1, which reduces the current demand and lowers the electrical capacity.

The particular advantage of an optical semiconductor component according to the invention is that the adaptation of the mode field of a light wave in the first transition area UBI is not dependent on a change in the energy band gap of the multi-quantum well structure. Above all this achieves that an optical semiconductor component according to the invention operates independently of polarization, i.e. that it processes light signals with different polarization directions equally.

In the first embodiment, the substrate SUB, buffer layer BUF and cover layer DS comprise a semiconductor of the III/V connection type, such as InP or GaAs. The two waveguide cores MQW, BULK comprise ternary or quaternary mixed crystals with elements of the main groups III and V, such as InGaAsP, InGaAs or InGaAlP. But compounds of elements from the main groups II and VI, IV and IV or I and VII are also suitable for the semiconductor component, depending on the wavelength at which the semiconductor component must operate.

In addition to minimized coupling losses when coupled to an optical fiber or an optical waveguide on a supporting plate, the optical semiconductor component BE1 of the invention has the additional advantage that an alignment between semiconductor component and fiber or supporting plate is simplified, since greater alignment tolerances than with conventional optical semiconductor components with a deep ridged waveguide are permissible for a low loss coupling. Thus a misalignment of 2 μm for example in the semiconductor component BE1 only increases the coupling losses by about 1 dB. Furthermore, no microlenses are required for coupling to an optical fiber, and simple single-mode optical fibers with a flat end can be used.

Figure 3:
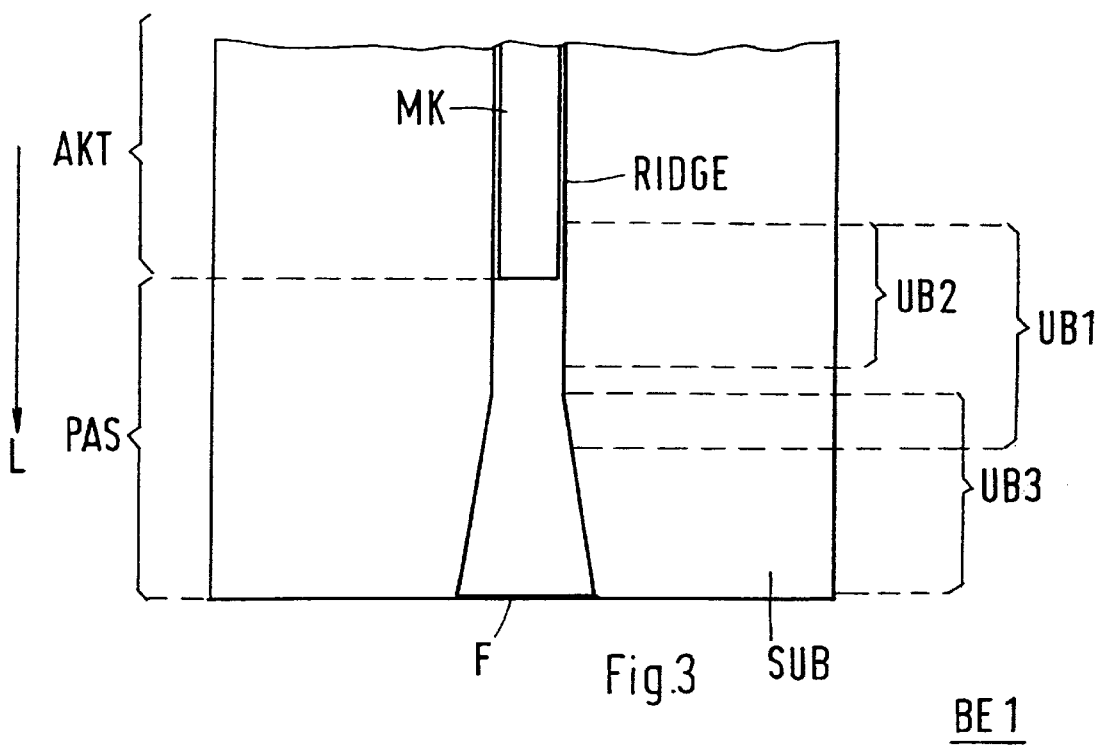
FIG. 3 is a plan view, i.e., a top view of the semiconductor component in the first embodiment.

FIG. 3 is a top view of the semiconductor component BE1 in the first embodiment. The substrate SUB with the deep ridged waveguide RIDGE placed over it can be seen. The ridged waveguide RIDGE has the form of a mesa strip.

In the first transition area UB1, the thickness of the second waveguide core BULK decreases along the longitudinal direction L. In the second transition area UB2, the thickness of the individual semiconductor layers in the multi-quantum well structure of the first waveguide core MQW decreases in the longitudinal direction L, which gives the ridged waveguide RIDGE an active AKT and a passive PAS waveguide area. In a third transition area, the width of the ridged waveguide RIDGE increases along the longitudinal direction L toward the front face F. This produces an additional expansion of the mode field of a light wave being conducted in the ridged waveguide RIDGE, particularly in a lateral direction.

The third transition area UB3 is arranged so that most of it at least is located in the longitudinal direction L behind the second transition area UB2, and partly overlaps the first transition area UB1. In this way the third transition area UB3, in which the ridged waveguide RIDGE expands laterally, is located entirely or at least mostly in the passive waveguide area PAS, and thus no modes of a higher order can be excited, even with a strong lateral expansion. Therefore the ridged waveguide RIDGE has a single mode.

The special advantage of the ridged waveguide RIDGE expansion lies in that, with a suitable expansion size, an outgoing light wave has a symmetrical mode field, which minimizes coupling losses.

Figure 4:
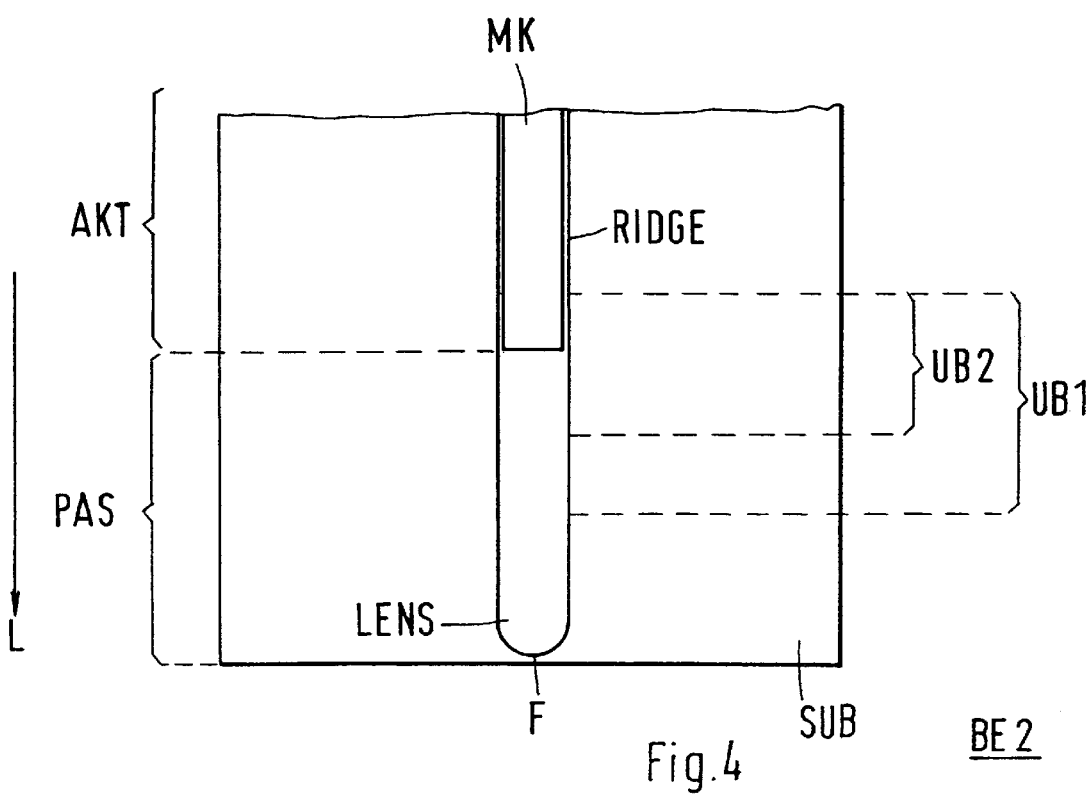
FIG. 4 is a top view of the semiconductor component in a second embodiment.

FIG. 4 is a top view of an optical semiconductor component BE2 according to the invention in a second embodiment. Like the semiconductor component BE1 in the first embodiment, it has the same vertical layer structure that is illustrated in FIG. 1. It shows the substrate SUB with the deep ridged waveguide RIDGE arranged thereon.

In the first transition area UB1, the thickness of the second waveguide core BULK decreases along the longitudinal direction L. In the second transition area UB2, the thickness of the individual semiconductor layers in the multi-quantum well structure of the first waveguide core MQW decreases in the longitudinal direction L, which gives the ridged waveguide RIDGE an active AKT and a passive PAS waveguide area.

On the front face F, the ridged waveguide RIDGE has a termination in the form of an integrated cylindrical lens LENS. The base of this integrated cylindrical lens LENS can be hyperbolic, parabolic or have the shape of a circle segment.

The special advantage of this design is that the cylindrical lens LENS produces an additional expansion of the mode field of the light wave. An appropriate shape of the base of the cylindrical lens LENS achieves that the mode field of the outgoing light wave is symmetrical, i.e. that the outgoing light wave produces a circular light spot instead of an elliptical one. In this design with a symmetrical mode field the coupling losses are minimal.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

What is claimed is:

1. An optical semiconductor component (BE1; BE2), which has a substrate (SUB) and a deep ridged waveguide (RIDGE) with a cover layer (DS) arranged on the substrate (SUB), wherein:

the ridged waveguide (RIDGE) contains a first waveguide core (MQW) and a second waveguide core (BULK), whose respective refractive indexes are greater than refractive indexes of the cover layer (DS) and the substrate (SUB);

the first waveguide core (MQW) contains one or several optically active semiconductor layers;

in a first transition area (UB1), a thickness of the second waveguide core (BULK) decreases along a longitudinal direction (L) of the deep ridged waveguide (RIDGE) and in a second transition area (UB2), a thickness of the first waveguide core (MOW) decreases in a same direction (L) along which the thickness of the second waveguide core (BULK) decreases in said longitudinal direction, but that the thickness of the second waveguide core decreases independently of the decrease of the first waveguide core.

2. An optical semiconductor component (BE1; BE2) as claimed in claim 1, characterized in that it has a front face (F) for incoming or outgoing light signals, and the thickness of the second waveguide core (BULK) decreases along the longitudinal direction (L) of the ridged waveguide (RIDGE) toward the front face (F).

3. An optical semiconductor component (BE1; BE2) as claimed in claim 1, characterized in that the decrease in a layer thickness of the second waveguide core (BULK) is continuous.

4. An optical semiconductor component (BE1; BE2) as claimed in claim 1, characterized in that the one or several optically active semiconductor layers of the first waveguide core (MQW) are a semiconductor packet with a multi-quantum well structure.

5. An optical semiconductor component (BE1; BE2) as claimed in claim 1, characterized in that in a third transition area (UB3), a width of the ridged waveguide (RIDGE) increases in a same direction (L) along which the thickness of the second waveguide core (BULK) decreases in said longitudinal direction.

6. An optical semiconductor component (BE1; BE2) as claimed in claim 2, characterized in that on the front face (F), the ridged waveguide (RIDGE) has a termination (LENS) in the form of an integrated cylindrical lens with a hyperbolic, parabolic or circle segment shaped base.

* * * * *

UNITED STATES PATENT AND TRADEMARK OFFICE
CERTIFICATE OF CORRECTION

PATENT NO. : 6,181,722 B1
DATED : January 30, 2001
INVENTOR(S) : Kaspar Dütting; Edgar Kühn It is certified that error appears in the above-identified patent and that said Letters Patent is hereby corrected as shown below:

Column 7,
Line 2, delete "MOW" and substitute -- MQW --.

Signed and Sealed this

Twenty-fifth Day of September, 2001

Attest:

*Nicholas P. Godici*

NICHOLAS P. GODICI
*Acting Director of the United States Patent and Trademark Office*

*Attesting Officer*